(12) United States Patent
Tilmans et al.

(10) Patent No.: US 6,297,072 B1
(45) Date of Patent: Oct. 2, 2001

(54) METHOD OF FABRICATION OF A MICROSTRUCTURE HAVING AN INTERNAL CAVITY

(75) Inventors: Hendrikus A. C. Tilmans, Maastricht (NL); Eric Beyne, Leuven; Myriam Van de Peer, Brussel, both of (BE)

(73) Assignee: Interuniversitair Micro-Elktronica Centrum (IMEC VZW), Leuven (BE)

( * ) Notice: Subject to any disclaimer, the term of this patent is extended or adjusted under 35 U.S.C. 154(b) by 0 days.

(21) Appl. No.: 09/293,750

(22) Filed: Apr. 16, 1999

(30) Foreign Application Priority Data

Apr. 17, 1998 (EP) .................................................. 98870085
Jun. 10, 1998 (EP) .................................................. 98870132

(51) Int. Cl.$^7$ .................................................. H01L 21/44
(52) U.S. Cl. ........................... 438/106; 438/456; 438/422
(58) Field of Search ................................ 438/25, 26, 433, 438/434, 456, 106, 422, 421, 411

(56) References Cited

U.S. PATENT DOCUMENTS

| 4,769,344 |   | 9/1988 | Sakai et al. . |
|---|---|---|---|
| 5,296,408 |   | 3/1994 | Wilbarg et al. . |
| 5,317,922 |   | 6/1994 | Bomback et al. . |
| 5,335,550 |   | 8/1994 | Satou . |
| 5,430,421 |   | 7/1995 | Bornand et al. . |
| 5,602,385 |   | 2/1997 | Mathieu et al. . |
| 5,610,431 |   | 3/1997 | Martin . |
| 5,929,728 | * | 7/1999 | Barnett et al. ........................ 333/239 |
| 6,124,145 | * | 9/2000 | Stemme et al. ......................... 438/26 |

FOREIGN PATENT DOCUMENTS

| 0 412 545 A2 |   | 8/1990 | (EP) . |
|---|---|---|---|
| 0 529 392 A1 |   | 8/1992 | (EP) . |
| 0 709 659 A2 |   | 5/1996 | (EP) . |
| 0 849 578 A1 |   | 6/1998 | (EP) . |
| 2 705 163 |   | 5/1993 | (FR) . |
| 2 748 156 |   | 4/1996 | (FR) . |
| 57093225 | * | 10/1982 | (JP) . |
| WO 98/05935 |   | 2/1998 | (WO) . |

OTHER PUBLICATIONS

Shoichi, Kakimoto, "Patent Abstracts of Japan," entitled "Vacuum Sealing Method of Vacuum Container for Pressure Transducer," European Patent Office, Publication No. 57093225, published Jun. 10, 1982.

Caillat, Patrice Fluxless Flip–Chip Technology (CEA–Technologies avancees) First Int. Flip Chip Syp. (San Jose, Calif.) (Feb. 1994.).

* cited by examiner

Primary Examiner—Caridad Everhart
(74) Attorney, Agent, or Firm—Knobbe Martens Olson & Bear LLP (57) ABSTRACT

A method of fabricating a microstructure having an inside cavity. The method includes depositing a first layer or a first stack of layers in a substantially closed geometric configuration on a first substrate. Then, performing an indent on the first layer or on the top layer of said first stack of layers. Then, depositing a second layer or a second stack of layers substantially with said substantially closed geometric configuration on a second substrate. Then, aligning and bonding said first substrate on said second substrate such that a microstructure having a cavity is formed according to said closed geometry configuration.

42 Claims, 8 Drawing Sheets

METHOD OF FABRICATION OF A MICROSTRUCTURE HAVING AN INTERNAL CAVITY

FIELD OF THE INVENTION

The present invention is related to a microstructure product and a method of fabricating of a microstructure having an internal and preferably sealed cavity.

The present invention is also related to specific applications of this method of fabricating of a microstructure.

BACKGROUND

Microstructures having an internal cavity can be formed by making an assembly of two chips or two wafers or a chip-on-wafer with a spacer in-between. Such structures should have hermetically sealed cavities filled with a controlled ambient (gas composition and/or pressure).

These structures can be used for many different applications such as microaccelerometers, microgyroscopes, microtubes, vibration microsensors, micromirrors, micromechanical resonators or "resonant strain gauges", micromechanical filters, microswitches and microrelays.

Traditionally, for these applications, the ambient of the cavity is defined during the assembly of the several components by anodic, fusion or eutectic wafer bonding, wafer bonding using low temperature glasses or polymers as the brazing material and reactive sealing techniques.

A common drawback of these techniques is that they are rather limited in applicability, since device separation is difficult (the device has been made on one of the two wafers). It is also difficult to create electrical contacts. The drawbacks of three of the most common techniques are discussed herebelow.

The technique of diffusion bonding of a Si cap wafer on the device wafer requires flat Si surfaces and a high temperature process.

Wafer bonding techniques such as anodic bonding and silicon fusion bonding require a very clean environment, i.e., low particle contamination. There are applications that are not compatible with these boundary conditions of temperature and flatness. Furthermore, the technique of anodic bounding also requires flat surfaces and needs the application of a high voltage in order to achieve the bonding.

Finally, the technique of gluing does not provide a real hermetic bond.

U.S. Pat. No. 5,296,408 describes a fabrication method of making a microstructure having a vacuum sealed cavity therein, including the process steps of forming an aluminum filled cavity in a body of silicon material and heating the structure such that the aluminum is absorbed into the silicon material leaving a vacuum in the cavity. In one embodiment, a cavity is etched into a silicon wafer and filled with aluminum. A silicon dioxide layer is formed over the aluminum filled cavity and the structure is heated to produce the vacuum cavity.

The document "Fluxless flip-chip technology" by Patrice Caillat and Gérard Nicolas of LETI, published at the First International Flip-Chip Symposium, San Jose, Calif., February 1994 describes a flip-chip assembly of two chips with a solder sealing ring defining a cavity during the assembly itself. The assembly and the subsequent sealing are normally done in air or under an $N_2$ purge. Similar conditions may exists for the other wafer bonding techniques as mentioned hereabove (except for the technique of reactive sealing).

Advantages of the Present Invention

The present invention is directed to a microstructure product and a method of fabricating a microstructure having an internal cavity. Preferably, the covity is sealed with a controlled ambient allowing a free choice of the sealing gas composition and the sealing pressure or vacuum.

The method preferably does not require special equipment to perform the fabrication of such microstructures in a vacuum or controlled inert gas ambient.

The method is suited for micro-electromechanical systems (MEMS) packaging wherein all the process steps are compatible with packaging equipment.

SUMMARY OF THE PRESENT INVENTION

The present invention is related to a method of fabricating a microstructure having an inside cavity, comprising:

making a first layer or a first stack of layers in a substantially closed geometric configuration on a first substrate;

creating an indent on the first layer or on the top layer of said first stack of layers;

making a second layer or a second stack of layers substantially with said substantially closed geometric configuration on a second substrate;

aligning and bonding said first substrate to said second substrate such that a microstructure having an inside cavity is formed according to said closed geometry configuration.

The indent preferably is formed with a groove made in one of the a layers such that when the two substrates are secured together, a connection, preferably a contacting channel, between the inside cavity of a microstructure and the outside ambient is created.

Such an indent can be made using a variety of different techniques including lithographic and/or chemical techniques or mechanical techniques removing a part of the first layer using a tool such as a shearing tool or cutting tool by applying a force using an indent tool on the first layer or by other steps.

As used herein, the term "making a layer on a substrate" means any type of method of providing a layer as the substrate including depositing or growing a layer on the substrate.

After the two substrates are secured together the indent is closed by reflowing the first layer at a reflow temperature. The reflow temperature is preferably at a temperature at which said first layer, or at least the top layer of the first stack of layers, is fusible but not the substrate and/or the other materials thereon. The reflow temperature can be lower than the melting temperature of the first layer or of one of the layers (the top layer) of the first stack of layers, the temperature being just high enough to achieve the closing of the indent and/or the corresponding fusion of the two substrates. The reflow temperature can also be equal to or above said melting temperature. Thus the reflow temperature is the temperature at which the first layer or the top layer of the first stack of layers has sufficient plasticity to reflow for closing the indent and achieving at the same time the fusion of the two substrates.

The inside cavity can contain any kind of device with a predetermined vacuum or inert gas ($N_2$, He, Ar, Xe, ...) atmosphere or any other kind of gaseous atmosphere.

One of the embodiments of the present invention makes use of a solder sealing ring that can be combined with standard solder bumps for electrical contact.

Advantages of the technique of the present invention include flexible packaging of devices. A good electrical contact between device and package is also made possible, the second or the first substrate can be a more complex device by itself, a hermetic cavity sealing can be achieved and the technique can be executed to a large extent at wafer-level.

It is a further advantage of bonding techniques based on a solder bond, that are less susceptible to particles. Furthermore, flip-chip solder bonds also have the interesting property of self-alignment (within certain limits) and display a good control, predictability and reproducibility of the solder height and thus the cavity height. Furthermore, a solder bond leads to a metallic seal, which is known to provide the best hermeticity possible. Also, the metallic seal can be used as an electrical feedthrough from one chip (e.g. the bottom chip) to the other (e.g. the top chip of the stack).

Further characteristics or advantages will be found in the following description of several preferred embodiments of the present invention.

DETAILED DESCRIPTION OF THE DRAWINGS

The present invention will be described more in detail hereunder referring to specific embodiments which are more precisely described in the drawings.

The method of fabrication of a microstructure having a sealed cavity, according to the present invention can be referred to as the indent-reflow-sealing (IRS) technique, which is based on a flip-chip technique using a fluxless soldering process, and which allows one to make hermetically sealed cavities with a controlled ambient (gas(es) and pressure) preferably at low temperature (typically of the order of 300° C.).

By controlled ambient, it should be understood that the inside ambient in the cavity is not in direct contact with the outside ambient. The pressure (or vacuum) in the cavity and/or its gas composition can therefore be adapted to the user requirements. The pressured (or vacuum) atmosphere in the cavity and/or its gas composition also can be adapted while forming the cavity.

The cavities are preferably formed by making an assembly of two chips (or two wafers, or chip-on-wafer) with a spacer in between. The spacer typically consists of a solder layer with or without an additional spacer layer. The alignment is done as a pick&place operation (in particular applicable for chip-on-wafer processes) on a flip-chip aligner/bonder. One of the advantages of the present invention is that the sealing is done in an oven as a post-assembly operation, i.e., not during the assembly operation itself. The fact that the cavity sealing is done in an oven makes the present method more flexible with respect to the choice of the sealing gas and the sealing pressure. Standard flip-chip assembly as used by Caillat et al. in the prior art, is done in air ambient, with or without a nitrogen flow over the devices.

From a manufacturing standpoint, it should further be noted that the IRS technique according to the present invention has a cost advantage as compared to the other methods of the state of the art. The pick&place operation done on the flip-chip aligner&bonder is in general the most time-consuming and most expensive step. By doing the reflow operating as a post-assembly step in an oven, the operate time on the flip-chip aligner is (drastically) reduced. In addition, large batches of chip-on-wafer (or chip-on-chip) assemblies can be sealed in an oven at the same time. All this results in a high throughput and reduction in manufacturing costs.

An element of the method according to the present invention is that the solder reflow and sealing is done in an oven as a post-assembly operation, not during the flip-chip assembly operation itself. This makes the present technique more flexible with respect to the choice of the sealing gas and the sealing pressure as compared to the prior art method used by Caillat et al. Furthermore, from a manufacturing standpoint it is concluded that a cost advantage is expected for the present technique.

A specific embodiment of the method of fabrication of a microstructure according to the present invention, which is based on the assembly chip-on-chip will be described hereunder with reference witoth FIGS. 1 to 6, wherein an explanation of the different processing steps follows hereunder:

Step 1: Preparation of the first chip (FIG. 1)
deposition and patterning of a metallization seed layer (5) on the first substrate or on a first chip (1),
preparation of a plating mould (e.g., polyimide which can be as thick as 100 $\mu$m) and electrodeposition (electroplating) of the solder (3). Some examples of possible solders can be SnPb63/37, SnPb5/95, SnPbAg (2% Ag), In, AuSn (80/20), SnAg, SnAgCu or SnBi,
removing the mould and making the indent or groove (4). This can also be conveniently done on wafer level, the wafer is next diced to obtain the individual chips.

Figure 1:
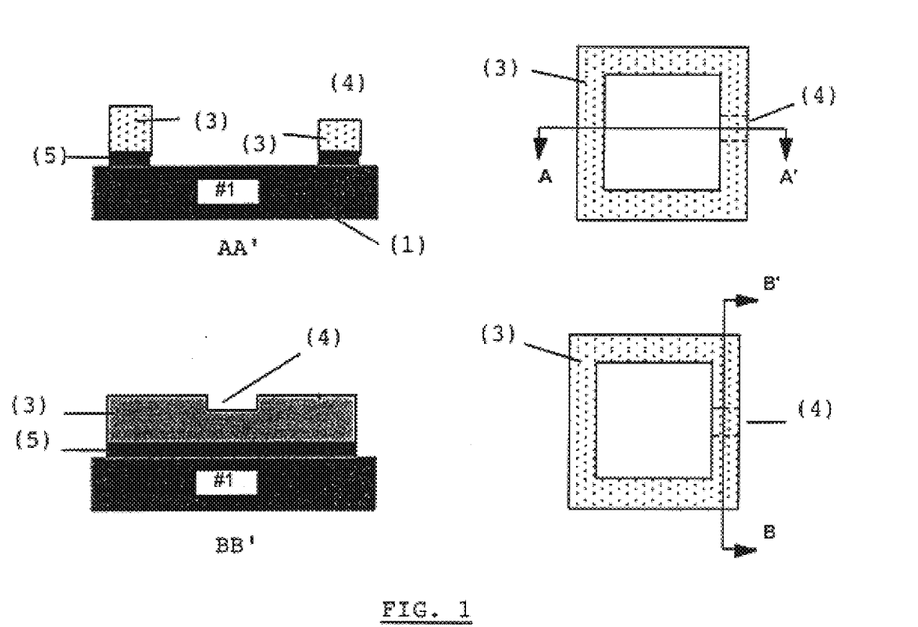
FIGS. 1 to 6 represent the several steps of a preferred embodiment of the method of fabrication of a microstructure having a sealed cavity according to the present invention.

Advantages of using solder in the method of the present invention are as follows:
the solder is of a soft material, thus allowing an indent to be made using a shearing tool or an indenting tool (soft should be understood as opposed to brittle, hard). The indent can be made in a photolithographic and/or chemical manner, or through mechanical means.
the solder can be reflowed at moderate temperatures (200–350° C.) well below the melting point of the substrate. Due to the high surface tension, the indent will completely disappear after reflow (the solder is brought back into its shape without any traces of the indent);
the solder can be electroplated using LIGA-like processing. It is thus convenient to define a geometrically enclosed structure forming an inside sealed cavity afterwards. In addition, electrodeposition allows the fabrication of high cavity walls (>5 $\mu$m). This facilitates the making of the indent as well.
the solder leads to an excellent hermetic seal of the cavity.

Step 2: Preparation of the second substrate or chip FIG. 2) deposition and patterning of a suitable metallization layer (6) on the second chip (2) (this can also be conveniently done on wafer level). The requirements for a suitable metallization layer should be adequately wettable and form a stable intermetallic compound with solder (3). For instance, if a SnPb-base solder is used in Step 1, most stable SnCu will be convenient. A seed layer of SnNi can also be used. Therefore, the SnNi layer needs also to be covered by a thin Au layer since Ni oxidises in air. A thickness of the Au layer will be in the range of 0.1–0.3 μm in order to be adequately wettable, while having a thicker Au layer will result in an unreliable solder connection. If a AuSn-base solder is used, a Au metallization will yield good results.

Figure 2:
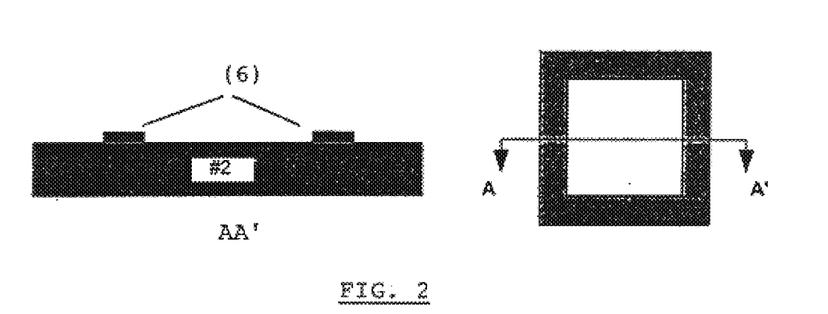

This metallization will serve as the counter metallization for the flip-chip operation (see step 3).

Figure 3:
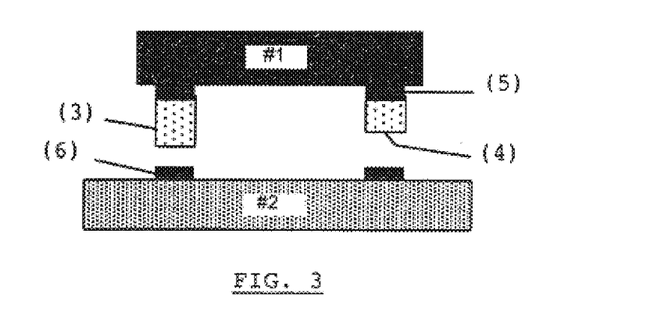

Step 3: Pre-treatment "flip-chip" alignement (FIG. 3)

On a flip-chip aligner & bonding device, both chips (1 & 2) are aligned so that the solder ring (3) on the first chip (1) is aligned with the metal ring (6) on the second chip (2). Before loading, both chips are preferably given an adequate plasma pretreatment in order to achieve a reliable adhesion (so-called "prebond", see step 4) of both chips without solder reflow.

Figure 4:
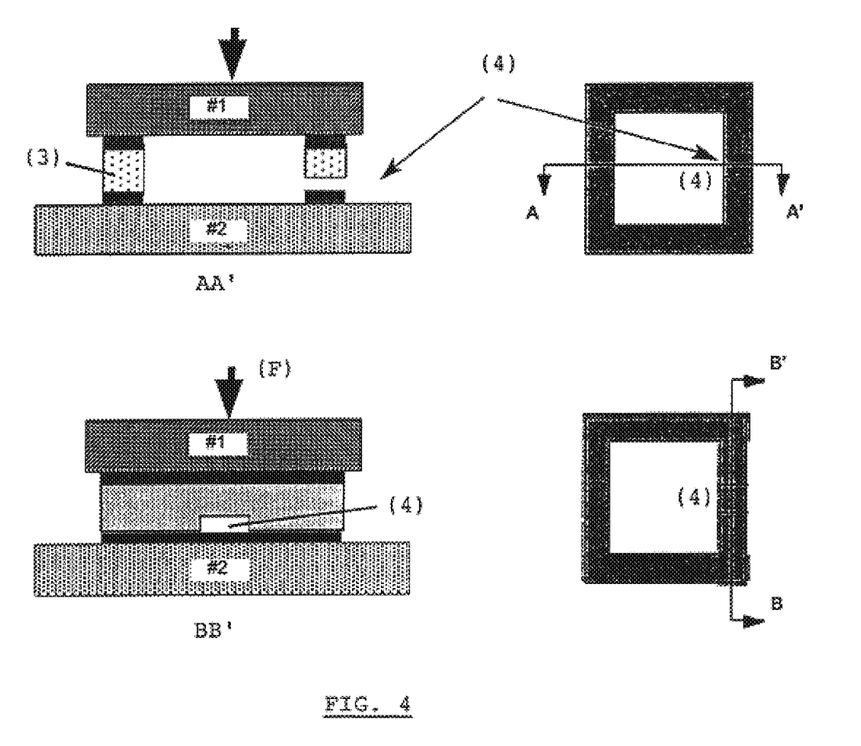

Step 4: Pre-bonding (FIG. 4)

Both chips are heated to a temperature well below the melting point of the solder (a softening temperature that is well below the reflow temperature), for instance for SnPb (67/37) having a melting point 183° C., the chips are typically heated to a temperature comprised between 120–160° C. The chips are next prebonded by applying a bonding force (F), (typically of 2000 gf) The chips now "stick" and can be moved to the reflow oven. The exact temperature and bonding force depend on the solder, the solder history and the type of metallization used.

Figure 5:
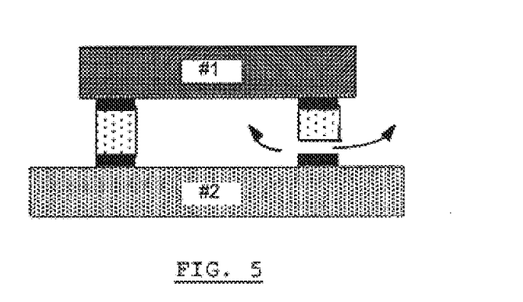

Step 5: Pump vacuum and filling of the cavity (FIG. 5)

In the reflow oven, the cavity (8) is evacuated and next filled with the desired gas such as $N_2$ or a gas mixture such as $N_2/H_2$ mixture or even SF6 to a required pressure. Optionally, the cavity could be evacuated to a vacuum pressure.

Figure 6:
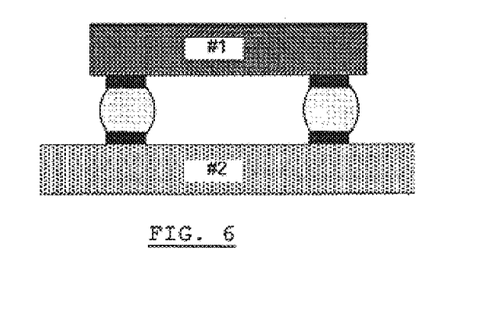

Step 6: Reflow and sealing (FIG. 6)

The temperature of the oven is now raised to about or above the melting point of the solder but below the melting point of all other materials used. The solder (3) will melt so as to close the indent resulting in a hermetically sealed cavity with a controlled ambient.

The process flow as represented in FIGS. 1 to 6 shows an assembly in which the cavity height is set by the solder itself, without using any additional spacer layer. However, the method of assemblying product with an additional spacer layer is described in reference to FIGS. 7 and 8.

Figure 7:
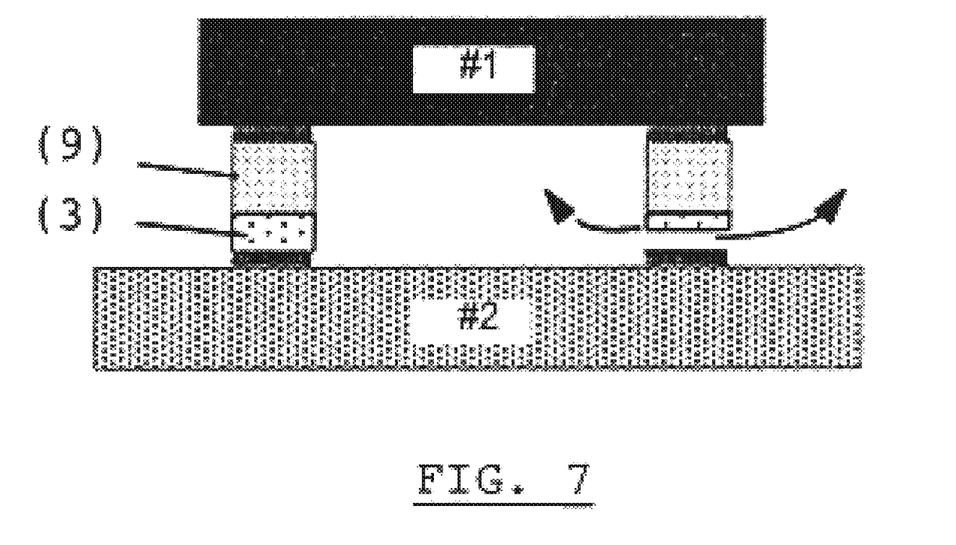
FIGS. 7 and 8 represent the two last steps of a second preferred embodiment of fabrication of a microstructure having a sealed cavity according to the present invention.
Figure 8:
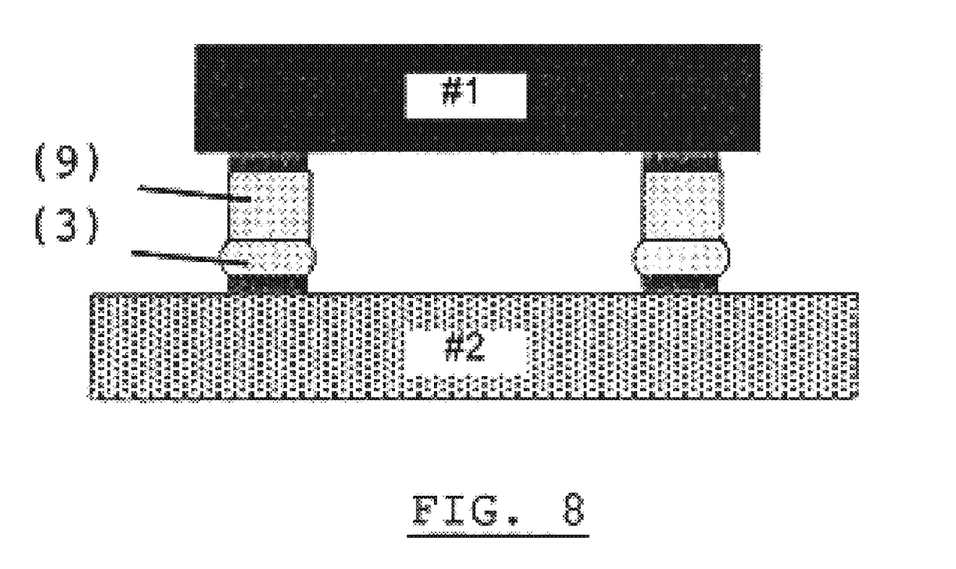

FIGS. 7 and 8 represent the last two process steps of the method of fabrication according to the present invention using a spacer layer (9) in combination with the solder layer (3) according to said cavity height.

Figure 9A:
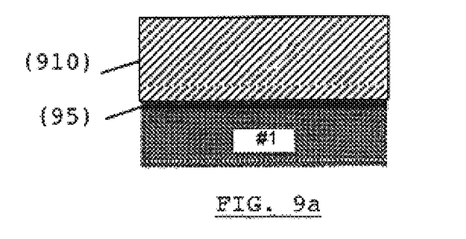
FIGS. 9 to 11 respectively represent in detail three alternative embodiments of methods of creating the indent in the fabrication of a microstructure having a sealed cavity according to the present invention.
Figure 9B:
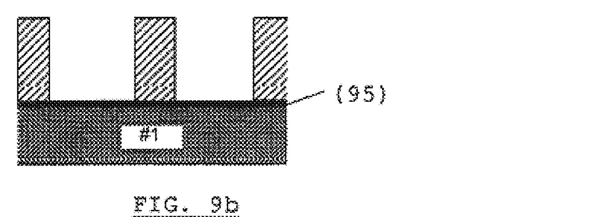
Figure 9C:
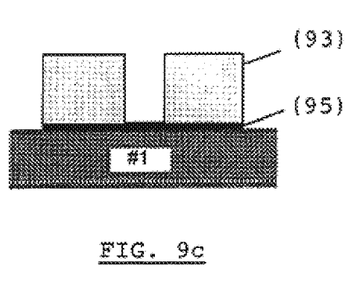
Figure 9D:
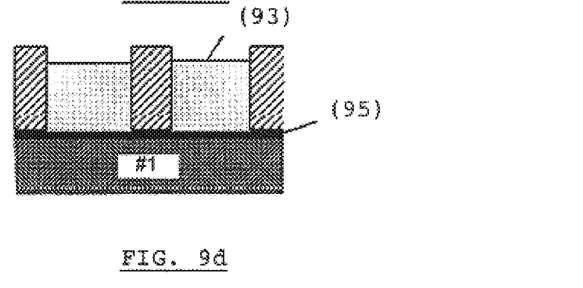
Figure 10:
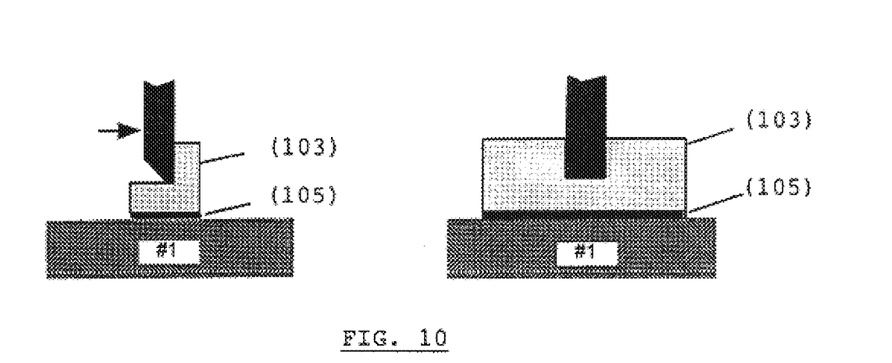
Figure 11:
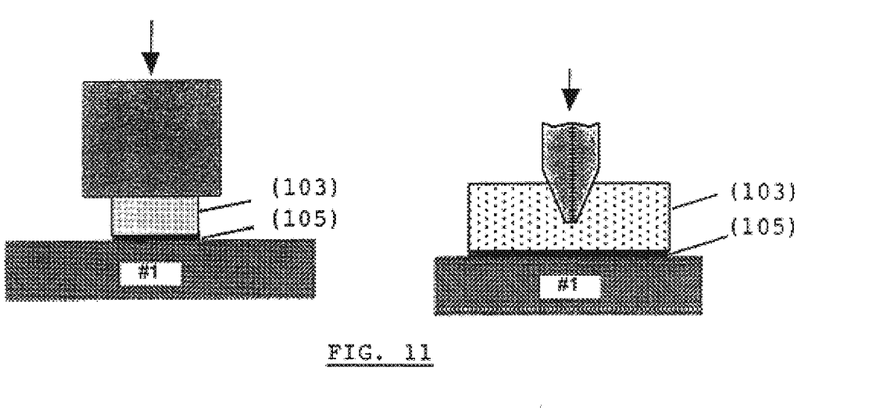
Figure 12:
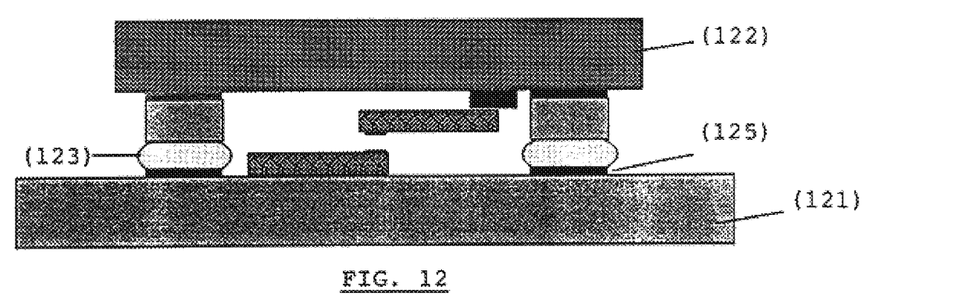
FIGS. 12 to 15 respectively represent several examples of applications of microstructures fabricated according to the method of the present invention.
Figure 13:
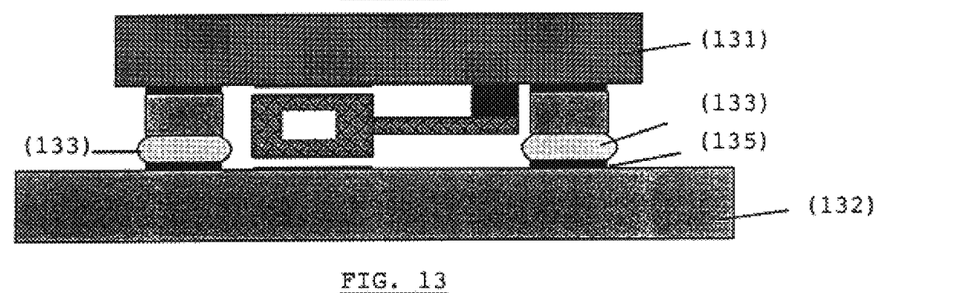
Figure 14:
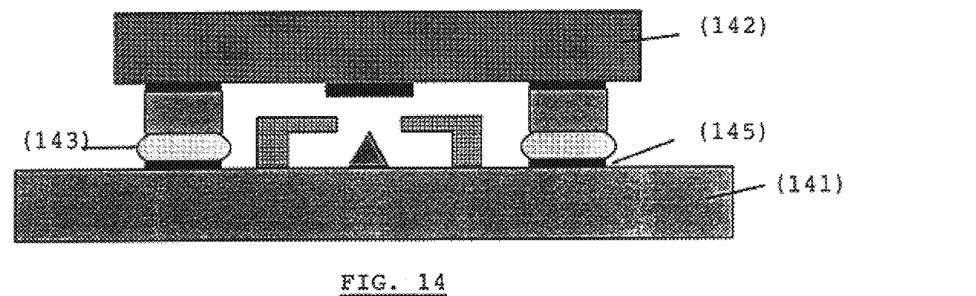
Figure 15:
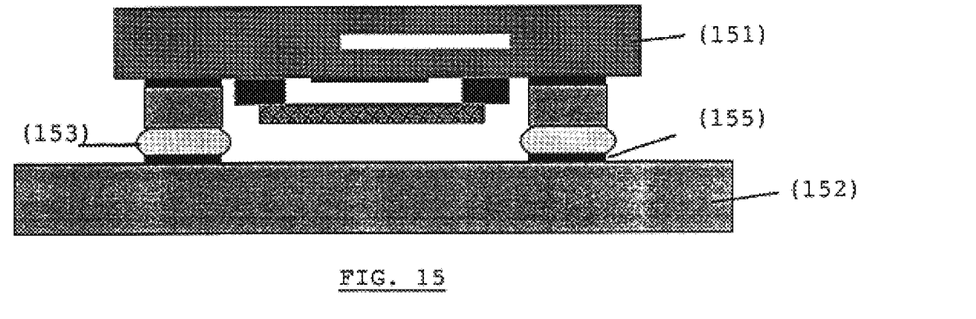

FIGS. 9, 10, and 11 represent in detail three methods of creating an indent in the preparation of one of the two chips.

More particularly, FIG. 9 represents local electrodeposition of the solder using a patterned mould (comparable to LIGA as 3D-microforming techniques), wherein:

FIG. 9a shows the deposition of a seed layer (95) the growing of a mould material (910) (e.g. photoresist, polyimide), and the patterning of the mould (910);

FIG. 9b shows the electrodeposition of the solder (93);

FIG. 9c shows the removing of the mould (910) and seed layer (95) (locally).

FIG. 10 represents a second method of creating an indentation by removing the solder using a shearing tool such as a shear tester.

FIG. 11 represents a third method of creating an indentation by using an indenter wherein the indent of the solder is made by applying a (high) force.

The two last embodiments represented in FIGS. 10 and 11 are possible because the solder is a soft material that allows an indentation by forcing a tool such as a shearing or an indenting tool.

FIGS. 12 to 15 represent several structures using the method of fabrication of a microstructure having a sealed cavity according to the present invention for specific applications such as a microreed switch (FIG. 12), a capacitive microaccelerator (FIG. 13), a vacuum microtriode (FIG. 14), a one-port microresonator using electrostatic drive/sense (FIG. 15), a microrelay (not represented), pressure sensors, light mirror devices, radiation (infrared up to X-rays) sensitive devices such as micropiles and bolometers. It is an advantage of the present invention that these devices are bulk or surface micro-machines having delicate surface structures such as membranes and moving parts. Therefore, they can not be encapsulated with a plastic moulding compound.

Furthermore, in several applications, these devices require access to light or electromagnetic radiation and more particularly to IR or UV light, X-rays, etc. Examples of such radiation applications are the packaging of imaging devices such as CMOS based imagers. In such case, the first or second substrate should be transparent for the electromagnetic radiation (light) or should at least comprise a portion of the substrate (a window) that is transparent for the radiation. Thus the second or first substrate can be chosen to be a material such as Ge-wafer or a Pb halogenide material or ZnS or quartz.

For some of the above-mentioned applications, a controlled atmosphere for proper operation is required, e.g. reference gas for IR sensor, nitrogen or He for low or high thermal conductivity. In packaging, the bolometer sensor disclosed in the patent application EP-A-0867702 can be an advantageous example of the packaging technique of the present invention. This technique also provides thermal isolation of the bolometer device. The thermal isolation is achieved by creating a vacuum atmosphere in the cavity. Also the presence of a noble gas of heavier atoms (Xe, Ar, . . . ) will be beneficial for the performance characteristics of the bolometer device.

Furthermore, in order to achieve commercial success, all these devices preferably should be produced in high volume and at low cost. The fabrication of a fully packaged electromagnetic micro-relay is hereunder described in details as a best mode embodiment of the present invention.

Best Mode Embodiment

Figure 16:
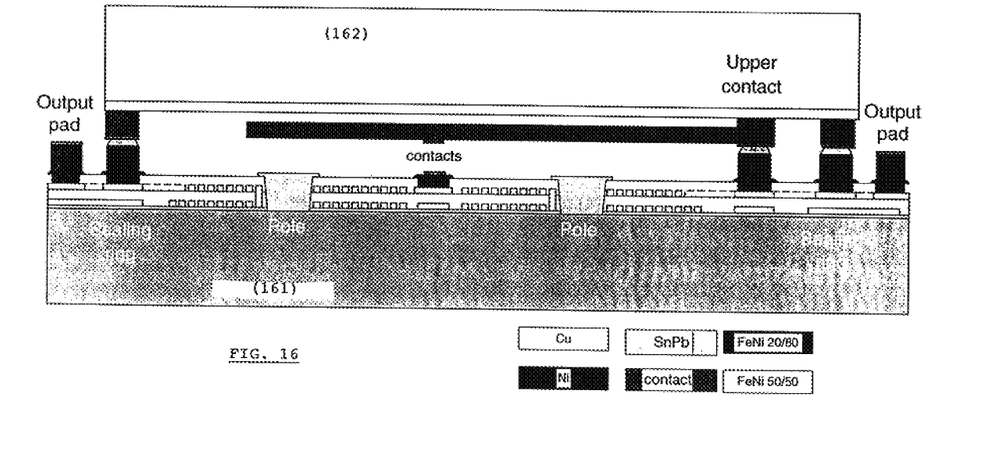
FIG. 16 represents a schematic cross section of a micro-relay in a package made in accordance with the principles of the present invention.

An integral design and fabrication approach incorporating all the key elements of a micro-relay, i.e., actuator, electrical contacts, housing of the electrical contacts, structural design, micro-machining fabrication process and packaging, has resulted in the micro-relay schematically shown in FIG. 16. The heart of the microrelay comprises two "flip-chip assemblied" chips (161) using the method of the present invention described hereabove.

The assembly process is based on the eutectic (162) bonding between electroplated tin lead (SnPb) and gold (Au) layers. One of the two chips of the assembly uses a ferromagnetic substrate (161) and comprises a U-core electromagnet, consisting of a double-layer Cu coil (cross section Cu winding 6×8 pm², total number of turns N=127), electroplated NiFe (50/50) poles (1×0.15 mm$^2$), and the lower electrical contact. The upper chip (162) uses an oxidised silicon substrate. The chip accomodates an armature consisting of a keeper plate (2×1.8 mm$^2$) and two supporting beams (1.6×0.15 mm$^2$) acting as springs, composed of approximately 20 $\mu$m thick electrodeposited NiFe (80/20). The keeper and the beams are suspended 1 $\mu$m above the silicon substrate (162). The upper contacts are deposited on the keeper plate. For the current design, the contacts are 0.20×0.15 mm$^2$ in size and are made of Au (1.5 $\mu$m on the keeper and 0.5 $\mu$m on the electromagnet). The contacts and the armature are housed in a hermetically sealed cavity, filled with either forming gas or air. The in-plane size of the cavity is defined by a metallic sealing ring, consisting of a spacer layer of electrodeposited nickel Ni covered with SnPb. Contact gap and actuation (pole) gap differ only by the total thickness of the contacts (approximately 2 $\mu$m), and are mainly set by the thickness of the Ni spacer layer, with a small contribution from the SnPb solder layer. For the current design, the contact gap spacing is approximately 22 $\mu$m, whereby the Ni spacer is close to 20 $\mu$m.

Figure 17A:
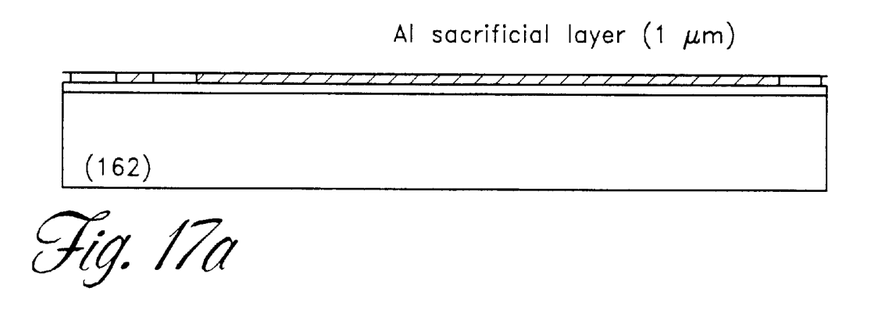
FIG. 17 represents the process-flow in order to fabricate the electromagnet chip which is the bottom chip of FIG. 16. starting from a FeSi substrate.
Figure 17B:
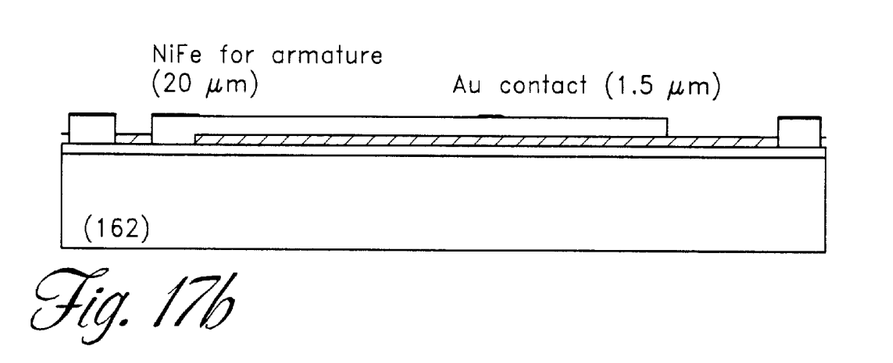
Figure 17C:
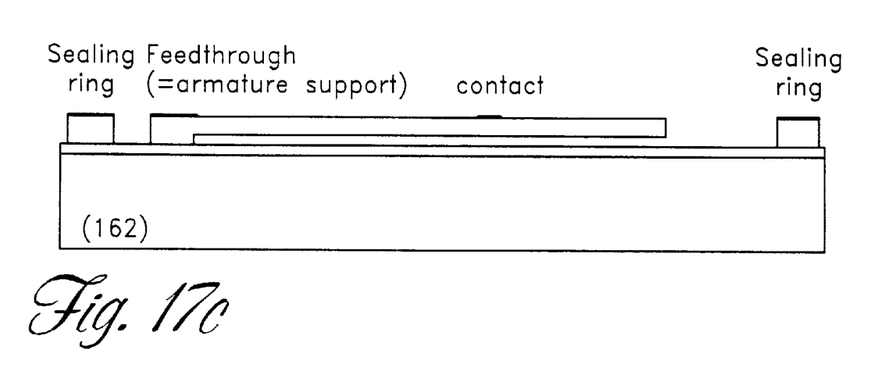

The fabrication of the electromagnet chip (161) with the multilayer coil starts with a ferromagnetic (FeSi, 3% silicon) substrate. The process-flow is represented in FIG. 17, wherein FIG. 17a represents the substrate (161) after the fabrication of the Cu coil; FIG. 17b represents the substrate (161) after "Ni-pad" and NiFe pole growing; FIG. 17c represents the substrate (161) after lapping and polishing poles and Ni pads, next deposition of the Ni-spacer and SnPb layer for the sealing ring and the feedthrough, and finally the deposition of the contact layer.

Figure 18A:
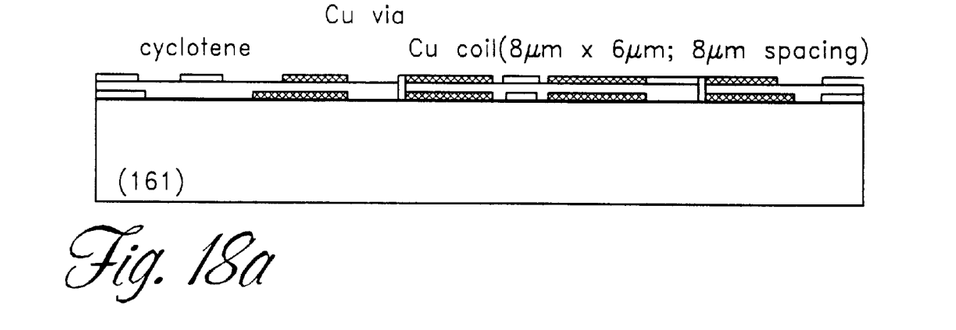
FIG. 18 represents the process-flow of the fabrication of the armature chip which is the upper chip of FIG. 16 starting from a silicon substrate.
Figure 18B:
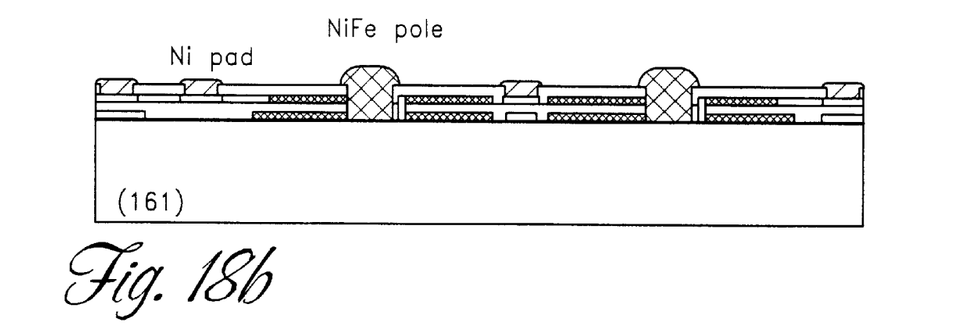
Figure 18C:
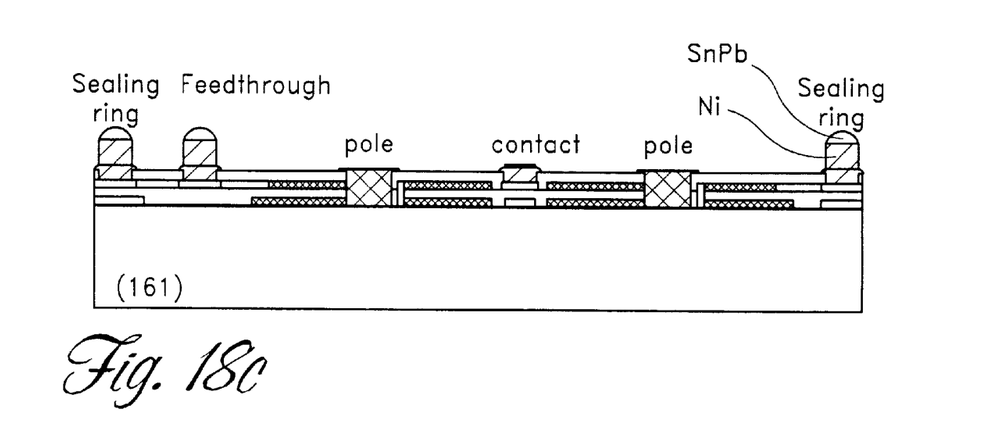

The sealing ring includes a double layer of a Ni spacer and a SnPb (e.g., eutectic 63/37) solder layer for making the flip-chip assembly bond. The fabrication process is based on 3D microforming technologies involving key steps such as electrodeposition of Cu for the coil windings and interconnects, of NiFe for the poles, of Ni for the spacer and moreover, of the SnPb solder for making the flip-chip assembly bond. Further steps are the preparation of a plating mould using BCB's (cyclotene) and lapping and polishing of the "overplated" metals. The armature chip (chip (162) in FIG. 16) uses a silicon substrate as the starting material. The process-flow is represented in FIG. 18, wherein FIG. 18a represents the substrate after patterning of the Al sacrificial layer; FIG. 18b represents the substrate after electrodeposition of the NiFe for the armature, followed by the deposition and patterning of the contact layer; and FIG. 18c represents the substrate after sacrificial layer etching of the Al in KOH.

Packaging focuses on low-cost, miniature packaging techniques. In addition to the four primary purposes of the package for integrated circuits, i.e., power distribution, signal distribution, power dissipation and mechanical support and protection, a fifth and very relevant function is to be added for micro-relays: definition of the housing and control of the ambient for the electrical contacts. The latter is referred to as 0-level packaging, as opposed to the 1-level packaging which comprises what is usually interpreted as packaging, i.e., the assembly capsule and the leads for interconnecting the assembly to the outside world.

The 0-level packaging deals with the fabrication of the cavity, which in the first place houses the electrical contacts (see FIG. 16). As such, it replaces the glass capsule of conventional reed switches and relays. The atmosphere in the capsule is generally nitrogen, forming gas or a vacuum and is tuned so as to increase the breakdown voltage and to improve the life expectancy of the switching contacts. For the micro-relay, the cavity is formed according to the low-temperature (<350° C.) flip-chip assembly process of the present invention of upper and bottom chips. The cavity is enclosed by both of these chips and by a geometrically enclosed sealing ring. For the reasons indicated before, the cavity must be hermetically sealed and must have a clean and controllable ambient. The term "Controllability" as used herein means an ambient containing a predetermined gas (e.g., nitrogen or SF$_6$) or gas mixture (e.g., forming gas) with a predetermined pressure (including a vacuum). As already indicated above, a metallic sealing ring can be implemented to meet the hermeticity requirements. For the under-bump-metallization (UBM), TiAu (0.02/0.12 um) is preferably used and for the top-surface-metallization (TSM), Au is used which is simultaneously deposited with the contact layer.

Controllability of the ambient is achieved with the method of the present invention. In addition to the above requirements, an electrical feedthrough must be implemented to interconnect the electrical contacts on the armature(upper) chip to the output pads which are located on the electromagnet (bottom) chip. The metallic stack of Ni spacer and SnPb can also provide this feedthrough as shown in FIG. 16.

The size of the relay configuration of FIG. 16 is set by the bottom electromagnet chip and is approximately 5.3×4.1 mm$^2$. The thickness of the flip-chip assembly is approximately 1 mm.

Upon energising the coil, the keeper is attracted towards the poles, thus closing the electrical contacts. The output of the relay can either be defined by the two bottom contacts whereby the keeper merely acts as a shorting element, or, by one (or both) bottom contacts and the upper contacts. In the latter case, the upper contact is interconnected to the output pad on the bottom chip via the supporting beams and the electrical feedthrough (FIG. 16) if a magnetic force F$_m$ acting on the keeper is in general limited by magnetic saturation of the keeper and/or by the residual pole gap spacing after closure. For the current design, F$_m$ is around 2 mN (saturation limited), which is calculated for a magnetomotive force NI>0.8 AT, a permeability $\mu_r$=2,000 and a saturation induction of 1 T of the keeper material, an average keeper length of 1.6 mm and a residual gap of 1 $\mu$m. The contact force F$_c$ (hereby assuming that pull-in has occurred) is limited by the maximum magnetic force minus the spring force, and thus, F$_c$<2 mN/2=1 mN (factor 2 arises because the force is distributed over two contacts). It should be noted that the spring force is determined by the stiffness of the supporting beams but also by the stiffness of the keeper plate. The latter will deform upon closure of the contacts and this way, an additional spring stiffness is introduced.

What is claimed is:

1. A method of fabricating a microstructure having an inside cavity comprising:

making at least a first layer in a substantially closed geometric configuration on a first substrate, said substantially closed geometric configuration defining a cavity therein;

creating an indent in said first layer;

making at least a second layer substantially with said substantially closed geometric configuration on a second substrate; and aligning and bonding said first substrate on said second substrate such that a microstructure is formed with said cavity formed within said closed geometric configuration.

2. The method as recited in claim 1, wherein the indent is created by using photolithographic and/or chemical acts.

3. The method as recited in claim 1, wherein the indent is created by removing a part of said first layer using a shearing tool.

4. The method as recited in claim 1, wherein the indent is created by applying a force with an indent tool on said first layer.

5. The method as recited in claim 1, wherein a pre-treatment prior to the aligning and bonding of said substrates is performed on both substrates, said pre-treatment including a plasma etching treatment.

6. The method as recited in claim 1, wherein a pre-bonding treatment is performed after the alignment of both substrates in order to form the microstructure.

7. The method as recited in claim 6, wherein the pre-bonding treatment comprises in heating the microstructure to a temperature well below the melting temperature of said first layer.

8. The method as recited in claim 1, wherein said first layer includes a solder layer essentially made of PbSn.

9. The method as recited in claim 1, wherein the first layer comprises a metallization seed layer.

10. The method as recited in claim 1, further comprising pumping said cavity to a predetermined pressure prior to and/or while executing the bonding.

11. The method as recited in claim 1, further comprising the step of filling the cavity with a gas or a gas mixture to a predetermined pressure prior to and/or while executing the bonding.

12. The method as recited in claim 11, wherein the gas is an inert gas.

13. The method as recited claim 1, wherein the indent is closed by reflowing the first layer at a reflow temperature above or equal to or just below the melting temperature of said first layer.

14. The method as recited in claim 13, wherein the reflowing is performed in a vacuum environment.

15. The method as recited in claim 14, wherein the reflowing is performed in an inert gas environment.

16. The method as recited in claim 1, wherein the reflowing is performed at a temperature which is less than the melting point of the substrates and the other structures thereon excluded of said first layer.

17. The method as recited in claim 1, wherein both substrates can be silicon or chips in silicon wafers or one substrate being a chip, the other substrate a wafer.

18. The method as recited in claim 1, wherein a window is made in one of the two substrates in order to let electromagnetic radiation to enter the cavity.

19. The method as recited in claim 1, wherein one of said substrates is transparent to electromagnetic radiation such that the radiation can enter the cavity.

20. The method, as recited in claim 1, wherein a microreed switch, a capacitive microaccelerator, a vacuum microtriode, a microresonator, a microrelay and a microswitch are realized.

21. A method of fabricating a microstructure having an inside cavity comprising:
    making at least a first stack of layers in a substantially closed geometric configuration on a first substrate thereby defining a cavity within said substantially closed geometric configuration;
    creating an indent on the top layer of said first stack of layers;
    making at least a second stack of layers substantially with said substantially closed geometric configuration on a second substrate; and
    aligning and bonding said first substrate on said second substrate such that a microstructure is formed with said cavity within said closed geometric configuration.

22. The method as recited in claim 21, wherein the indent is created by using photolithographic and/or chemical acts.

23. The method as recited in claim 21, wherein the indent is created by removing a part of at least one of the layers of the first stack of layers using a shearing tool.

24. The method as recited in claim 21, wherein the indent is created by applying a force with an indent tool on at least one of the layers of the first stack of layers.

25. The method as recited in claim 21, wherein a pre-treatment prior to the aligning and bonding of said substrates is performed on both substrates, said pre-treatment including a plasma etching treatment.

26. The method as recited in claim 21, wherein a pre-bonding treatment is performed after the alignment of both substrates in order to form the microstructure.

27. The method as recited in claim 26, wherein the pre-bonding treatment comprises in heating the microstructure to a temperature well below the melting temperature of at least one of the layers of the first stack of layers.

28. The method as recited in claim 21, wherein said first stack of layers includes a solder layer essentially made of PbSn.

29. The method as recited in claim 21, wherein the first stack of layers comprises a metallization seed layer.

30. The method as recited in claim 21, further comprising pumping said cavity to a predetermined pressure prior to and/or while executing the bonding.

31. The method as recited in claim 21, further comprising filling the cavity with a gas or a gas mixture to a predetermined pressure prior to and/or while executing the bonding.

32. The method as recited in claim 31, wherein the gas is an inert gas.

33. The method as recited claim 21, wherein the indent is closed by reflowing the top layer of the first stack of layers at a reflow temperature above or equal to or just below the melting temperature of at least one of the layers of said first stack of layers.

34. The method as recited in claim 33, wherein the reflowing is performed in a vacuum environment.

35. The method as recited in claim 34, wherein the reflowing is performed in an inert gas environment.

36. The method as recited in claim 21, wherein the reflowing is performed at a temperature which is less than the melting point of the substrates and the other structures thereon excluded at least one of the layers of said first stack of layers.

37. The method as recited in claim 21, wherein both substrates can be silicon or chips in silicon wafers or one substrate being a chip, the other substrate a wafer.

38. The method as recited in claim 21, wherein a window is made in one of the two substrates in order to let electromagnetic radiation to enter the cavity.

39. The method as recited in claim 21, wherein one of said substrates is transparent to electromagnetic radiation such that the radiation can enter the cavity.

40. The method, as recited in claim 21 wherein a microreed switch, a capacitive microaccelerator, a vacuum microtriode, a microresonator, a microrelay and a microswitch are realised.

41. A method of fabricating a microstructure having an inside cavity comprising;
    making at least a first stack of layers including a solder layer essentially made of PbSn in a substantially closed geometric, configuration on a first substrate, thereby defining a cavity;
    creating an indent on the top layer of said first stack of layers;

making at least a second stack of layers substantially with said substantially closed geometric configuration on a second substrate; and aligning and bonding said first substrate on said second substrate such that a microstructure is formed with said cavity formed within said closed geometric configuration.

42. A method of fabricating a microstructure having an inside cavity, the method comprising:

forming at least a first layer in a substantially closed geometric configuration on a first substrate thereby defining a cavity within said substantially closed geometric configuration, wherein said first layer includes a solder layer essentially made of PbSn:

creating an indent in said first layer;

making at least a second layer substantially with said substantially closed geometric configuration on a second substrate; and aligning and bonding said first substrate on said second substrate such that a microstructure is formed with said cavity formed within said closed geometric configuration.

* * * * *